US008742828B2

(12) United States Patent
Naumann et al.

(10) Patent No.: US 8,742,828 B2
(45) Date of Patent: Jun. 3, 2014

(54) DISCONNECTOR SWITCH FOR GALVANIC DIRECT CURRENT INTERRUPTION

(75) Inventors: Michael Naumann, Feucht (DE); Thomas Zitzelsperger, Unterhaching (DE); Frank Gerdinand, Helmstedt (DE)

(73) Assignee: Ellenberger & Poensgen GmbH, Altdorf (DE)

( * ) Notice: Subject to any disclaimer, the term of this patent is extended or adjusted under 35 U.S.C. 154(b) by 0 days.

(21) Appl. No.: 13/240,505

(22) Filed: Sep. 22, 2011

(65) Prior Publication Data

US 2012/0007657 A1 Jan. 12, 2012

Related U.S. Application Data

(63) Continuation of application No. PCT/EP2010/000607, filed on Feb. 2, 2010.

(30) Foreign Application Priority Data

Mar. 25, 2009 (DE) ..................... 20 2009 004 198 U

(51) Int. Cl.
*H03K 17/687* (2006.01)

(52) U.S. Cl.
USPC ........................................... 327/434; 327/419

(58) Field of Classification Search
USPC ................. 327/419, 427–437; 361/2, 6–8, 13
See application file for complete search history.

(56) References Cited

U.S. PATENT DOCUMENTS

| | | | | |
|---|---|---|---|---|
| 7,079,363 | B2 | 7/2006 | Chung | |
| 7,646,178 | B1 * | 1/2010 | Fradella | 322/46 |

FOREIGN PATENT DOCUMENTS

| | | | |
|---|---|---|---|
| CN | 1452194 | A | 10/2003 |
| DE | 4317965 | A1 | 12/1994 |
| DE | 10315982 | A1 | 11/2003 |
| DE | 10225259 | B3 | 1/2004 |
| DE | 102005040432 | A1 | 3/2007 |
| DE | 202008010312 | U1 | 10/2008 |
| EP | 1881511 | A1 | 1/2008 |
| JP | 52093808 | A | 6/1977 |
| JP | 08106839 | A | 4/1996 |
| WO | 9428567 | A1 | 12/1994 |
| WO | 02071429 | A1 | 9/2002 |
| WO | 2007022744 | A1 | 3/2007 |
| WO | 2010012629 | A2 | 2/2010 |

OTHER PUBLICATIONS

Van Gelder et al., "Zero volt switching hybrid DC circuit breakers", Industry Applications Conference, 2000. Conference Record of the 2000 IEEE Oct. 8-12, 2000, Piscataway, NY, USA, IEEE, vol. 5, pp. 2923-2927, XP010521702.

* cited by examiner

*Primary Examiner* — Lincoln Donovan
*Assistant Examiner* — Diana J Cheng
(74) *Attorney, Agent, or Firm* — Laurence A. Greenberg; Werner H. Stemer; Ralph E. Locher

(57) ABSTRACT

A disconnecting apparatus for direct current interruption between a direct current source and an electrical device, in particular between a photovoltaic generator and an inverter, has a current-conducting mechanical switching contact and semiconductor electronics connected in parallel with the switching contact. The semiconductor electronics are non-conducting when the switching contact is closed, wherein a control input of the semiconductor electronics is wired with the switching contact in such a way that, when the switching contact opens, an arc voltage generated as a result of an arc via the switching contact switches the semiconductor electronics to become conducting.

7 Claims, 3 Drawing Sheets

DISCONNECTOR SWITCH FOR GALVANIC DIRECT CURRENT INTERRUPTION

CROSS-REFERENCE TO RELATED APPLICATION

This application is a continuation, under 35 U.S.C. §120, of copending international application No. PCT/EP2010/000607, filed Feb. 2, 2010, which designated the United States; this application also claims the priority, under 35 U.S.C. §119, of German patent application No. DE 20 2009 004 198.0, filed Mar. 25, 2009; the prior applications are herewith incorporated by reference in their entirety.

BACKGROUND OF THE INVENTION

Field of the Invention

The invention relates to a disconnecting apparatus for direct current interruption between a direct current source and an electrical device, having a current-conducting mechanical switching contact and semi-conductor electronics connected in parallel therewith. The apparatus is particularly suited for connection between a photovoltaic generator and an inverter and acts as a current barrier when the switching contact is closed. When the semiconductor electronics become current-conductive, the arc current is commutated from the switching contact to the semiconductor electronics.

A disconnecting apparatus of the generic type is described, for example, in German published patent application DE 10 2005 040 432 A1.

The terms direct current source or d.c. source is hereby understood in particular to be a photovoltaic generator (solar installation). The term electrical device is understood, in particular, to be an inverter.

German utility model DE 20 2008 010 312 U1 (Gebrauchsmuster) describes a photovoltaic installation or solar installation having a so-called photovoltaic generator which for its part consists of solar panels combined in groups to form partial generators, connected in series or present in parallel rows. While a partial generator delivers its direct current output via two terminals, the direct current output of the whole photovoltaic generator is fed via an inverter into an alternating current voltage network. In order thereby to minimize the complexity of cabling and power losses between the partial generators and the central inverter, so-called generator junction boxes are arranged close to the partial generators. The direct current output commutated in this way is normally conducted via a common cable to the central inverter.

Depending on the system, a photovoltaic installation permanently delivers an operating current and an operating voltage in the range between 180V (DC) and 1500V (DC). On the other hand, for example for the purpose of installation, mounting or servicing, and in particular generally to protect people too, a reliable disconnection is desired of the electrical components or devices from the photovoltaic installation which acts as a direct current source. A corresponding disconnecting apparatus must be able to effect an interruption under load, i.e. without any prior switching off of the direct current source.

For load disconnection, a mechanical switch (switching contact) can be used which has the advantage that a galvanic disconnection of the electrical device (inverter) from the direct current source (photovoltaic installation) is effected when the contact has been opened. The disadvantages, however, exist that such mechanical switching contacts become worn out very quickly because of the arc which occurs when the contact is opened, and that additional expense is required in order to enclose and cool down the arc, which is normally effected by a corresponding mechanical switch with an extinguishing chamber.

If, in contrast, powerful semiconductor switches are used for the load disconnection, unavoidable power losses at the semiconductors also occur in normal operation. In addition, no galvanic disconnection and hence no reliable protection for people is ensured with such power semiconductors.

German Patent No. DE 102 25 259 B3 describes an electrical plug-in connector, designed as a load disconnector, which, in the manner of a hybrid switch, has a semiconductor switch element in the form, for example, of a thyristor in the housing of the inverter as well as main and auxiliary contacts which are connected to photovoltaic panels. The main contact, which is the leading one in the unplugging process, is connected in parallel with the trailing auxiliary contact and the auxiliary contact connected in series with the semiconductor switch element. The semiconductor switch element is here controlled in order to prevent the occurrence of an arc or extinguish such an arc, by being periodically switched on and off.

U.S. Pat. No. 7,079,363 B2 and its counterpart German Patent DE 103 15 982 describes, for the interruption of direct current, a hybrid electromagnetic direct current switch with an electromagnetically actuated main contact and an IGBT (insulated gate bipolar transistor) as the semiconductor switch.

However, known hybrid switches always have an external energy source for controlling the semiconductor switch and for operating semiconductor electronics into which the semiconductor switch is inserted.

SUMMARY OF THE INVENTION

It is accordingly an object of the invention to provide a contactor for galvanic direct current interruption which overcomes the above-mentioned disadvantages of the heretofore-known devices and methods of this general type and which provides for a particularly suitable disconnecting apparatus for direct current interruption between a direct current source, in particular a photovoltaic generator, and an electrical device, in particular an inverter.

With the foregoing and other objects in view there is provided, in accordance with the invention, a disconnecting apparatus for direct current interruption between a direct current source (e.g., photovoltaic generator) and an electrical device (e.g., inverter, converter), comprising:

a current-conducting mechanical switching contact connected between the direct current source and the electrical device;

semiconductor electronics connected in parallel with said switching contact, said semiconductor electronics acting as a current barrier when said switching contact is closed, and when said semiconductor electronics become current-conductive, an arc current is commutated from said switching contact to said semiconductor electronics;

said semiconductor electronics having a first semiconductor switch and a second semiconductor switch respectively connected in series;

said semiconductor electronics having a control input connected to said switching contact such that, when said switching contact opens, an arc voltage across said switching contact generated as a consequence of an arc renders said semiconductor electronics current-conductive;

said semiconductor electronics having an energy storage device connected to be charged as a consequence of the arc within an arc duration; and a timer configured to start at an end of a charging time of said energy storage device in order to switch off said semiconductor electronics with no arc being formed.

In other words, the objects are achieved, in accordance with the invention, in that the disconnecting switch suitably comprises a mechanical switching contact which is designed for an arc of short duration, i.e. for an arc duration of less than 1 ms, preferably less than or equal to 500 μs. The mechanical switching contact (switch or disconnecting element) is connected in parallel with semiconductor electronics which comprise a first semiconductor switch, preferably an IGBT, and a secondary semiconductor switch, preferably a MOSFET.

The semiconductor electronics of the disconnecting switch according to the invention have no additional energy source and consequently, when the mechanical switch is closed, act as a current barrier, i.e. have a high impedance and are thus virtually current-free and voltage-free. As, when the mechanical switching contacts are closed, no current flows across the semiconductor electronics and therefore there is no voltage drop in particular across the or each semiconductor switch, the semiconductor circuit also causes no power losses when the mechanical switch is closed. Instead, the semiconductor electronics obtain the energy it needs for operation from the disconnecting apparatus, i.e. from the disconnecting switch system itself. The energy of the arc which occurs when the mechanical switch is opened is called on and used for this. A control input for the semiconductor electronics or the semiconductor switch is hereby connected to the mechanical switching contacts in such a way that, when the switch opens, the arc voltage, across the switch or its switching contacts and the semiconductor electronics connected in parallel therewith, as a consequence of the arc makes the semiconductor electronics current-conductive, i.e. with a low impedance and hence current-carrying.

As soon as the semiconductor electronics become even slightly current-conductive, the arc current begins to commutate from the mechanical switch to the semiconductor electronics. The corresponding arc voltage or the arc current hereby charges an energy storage device, preferably in the form of a capacitor, which discharges with the generation of a control voltage specifically in order to switch off the semiconductor electronics with no arc being formed. The preset duration or time constant and hence the charging duration of the energy storage device or capacitor determines the duration of the arc.

Following the charging process, a timer preferably starts, during which the semiconductor electronics are controlled with no arc being formed and so as to create a current barrier. The duration of the timer is thus set so as to ensure safe extinguishing and reliable cooling of the arc or plasma.

The invention thus starts from the concept that a hybrid disconnecting apparatus designed as a pure two-terminal network can be used for shockproof and reliable direct current interruption, when semiconductor electronics can be used without their own source of auxiliary energy. This in turn can be achieved, as is recognized, by the arc energy that is generated when a mechanical switch connected in parallel with the electronics is opened being used for the operation of electronics. To do this, the electronics could have an energy storage device which stores at least part of the arc energy which is then made available to the electronics for a determined operating period which should be calibrated so as to ensure reliable extinguishing of the arc.

In a preferred embodiment, the capacitor expediently provided as an energy storage device determines, in conjunction with an ohmic resistor, the charging duration or charging time constant of the energy storage device. The charging duration of the energy storage device and hence the arc duration is preferably set at less than 1 ms, and expediently at less than or equal to 0.5 ms. This duration is, on the one hand, short enough to reliably prevent undesired contact erosion of the switching contacts of the mechanical switch. On the other hand, this duration is long enough to ensure self-supply of the semiconductor electronics for the subsequent duration determined by the timer and within which the electronics are controlled from the low-impedance commutating state into the high-impedance switched-off state (starting state). After the timer has elapsed, it is ensured that the extinguished arc cannot reoccur even with electronics connected with high impedance. Reliable disconnection and direct current interruption are consequently obtained.

A further mechanical disconnecting switch is suitably provided as an additional safety element for a reliable galvanic interruption and disconnection and is connected in series with the parallel circuit consisting of the mechanical switch and the semiconductor electronics.

In a particularly preferred embodiment, the semiconductor electronics comprise, in addition to the power or semiconductor switch preferably designed as an IGBT, a further power or semiconductor switch which preferably takes the form of a MOSFET (metal oxide semiconductor field-effect transistor). The IGBT which can be controlled almost without any power and displays good transmission characteristics at a high blocking voltage is thus connected suitably in series with the further semiconductor switch (MOSFET) in the manner of a cascode arrangement. The semiconductor switches thus form a commutation path parallel with the main current path formed by the mechanical switch and onto which the arc current is increasingly commutated with the mechanical switch open and as a consequence of the or each semiconductor switch being turned on. The arc voltage which decreases during the commutation across the hybrid disconnecting switch and hence across the semiconductor electronics is between approximately 15V and 30V.

The first semiconductor switch (IGBT) is first turned on in such a way that sufficient voltage to charge the energy storage device, for example 12V (DC), can be tapped between the two semiconductor switches, in other words at a cascode center tap, as it were.

This voltage is used to charge the energy storage device and its stored energy is used in turn to control the semiconductor switches in the semiconductor electronics, so that the two semiconductor switches which are to be switched through can be completely switched off again, i.e. controlled so that they act as a current barrier. The main path is then opened galvanically and the commutation path parallel thereto has a high impedance with the result that the high direct current voltage (permanently) generated by the direct current source appears at the hybrid disconnecting switch with, for example, more than 1000V (DC). It can therefore be ensured by the timer that not only is the arc extinguished but the plasma thereby created is also cooled.

Complete galvanic direct current interruption is obtained by opening the mechanical disconnecting switch that is connected in series with this autarchic, i.e., self-sufficient, hybrid switch.

The advantages obtained with the invention consist in particular in that no external energy source or additional auxiliary energy is required to supply the electronics, owing to the use of an autarchic hybrid disconnecting apparatus in which the semiconductor electronics remove the energy needed for their own supply of voltage from the arc which occurs when the mechanical switch is opened. The semiconductor electronics are preferably designed as a two-terminal network and have high impedance when the mechanical switch is closed, so that virtually no power losses occur at the hybrid disconnecting apparatus according to the invention during normal load operation.

The disconnecting apparatus according to the invention is preferably also suitably provided to interrupt direct current in the direct current voltage range up to 1500V (DC). In the preferred use of the additional mechanical disconnecting switch, this autarchic hybrid disconnecting apparatus is therefore particularly suited for reliable and shockproof galvanic direct current interruption both between a photovoltaic installation and an inverter associated therewith and in conjunction with, for example, a fuel cell system or an accumulator (battery).

Other features which are considered as characteristic for the invention are set forth in the appended claims.

Although the invention is illustrated and described herein as embodied in a switch disconnector for galvanic direct current interruption, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
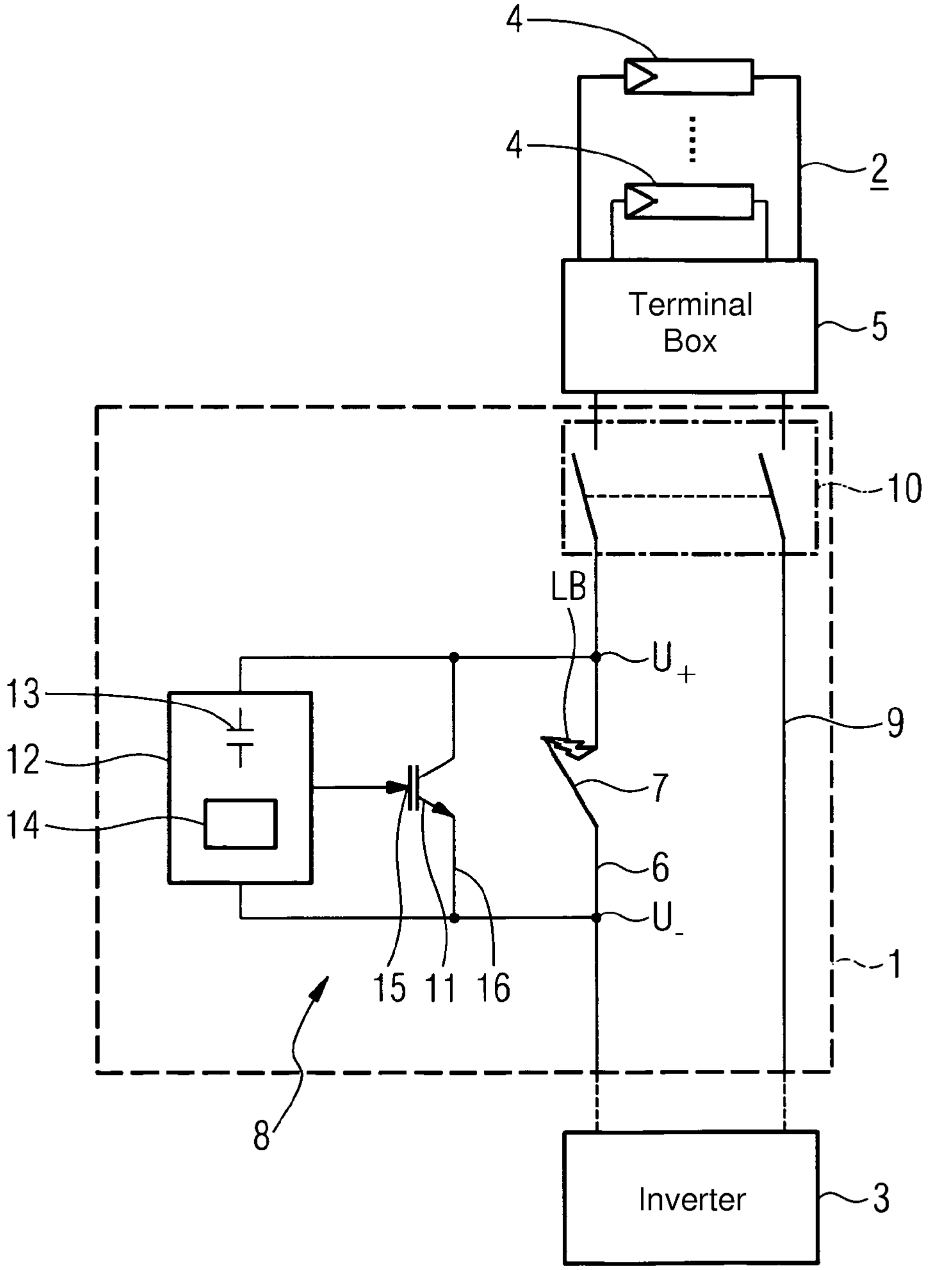
FIG. 1 is a block circuit diagram of the disconnecting apparatus according to the invention with an autarchic hybrid disconnecting switch between a photovoltaic generator and an inverter.

Referring now to the figures of the drawing in detail and first, particularly, to FIG. 1 thereof, there is shown a diagrammatic illustration of a disconnecting apparatus 1 which may also be referred to as an interruptor 1. In the exemplary embodiment, the disconnecting apparatus 1 is connected between a photovoltaic generator 2 and an inverter 3. The photovoltaic generator 2 comprises a number of solar panels 4 which lie parallel with one another and are led to a common generator junction box 5, or terminal cabinet 5, which serves, as it were, as an energy collection point.

The disconnecting apparatus 1 comprises, in the main current path 6 representing the positive terminal, a switching contact 7 which is also referred to below as a mechanical switch, and semiconductor electronics 8 connected in parallel therewith. The mechanical switch 7 and the semiconductor electronics 8 form an autarchic hybrid disconnecting switch. A further hybrid disconnecting switch 7, 8 can, in a manner not shown in more detail, be connected in the return line 9, representing the negative terminal, of the disconnecting apparatus 1, and hence the whole installation.

Mechanically coupled-together switching contacts of a further mechanical disconnecting element 10 can be arranged both in the outward line (main path) 6 representing the positive terminal and in the return line 9 for a complete galvanic disconnection or direct current interruption between the photovoltaic generator 2 and the inverter 3.

Figure 2:
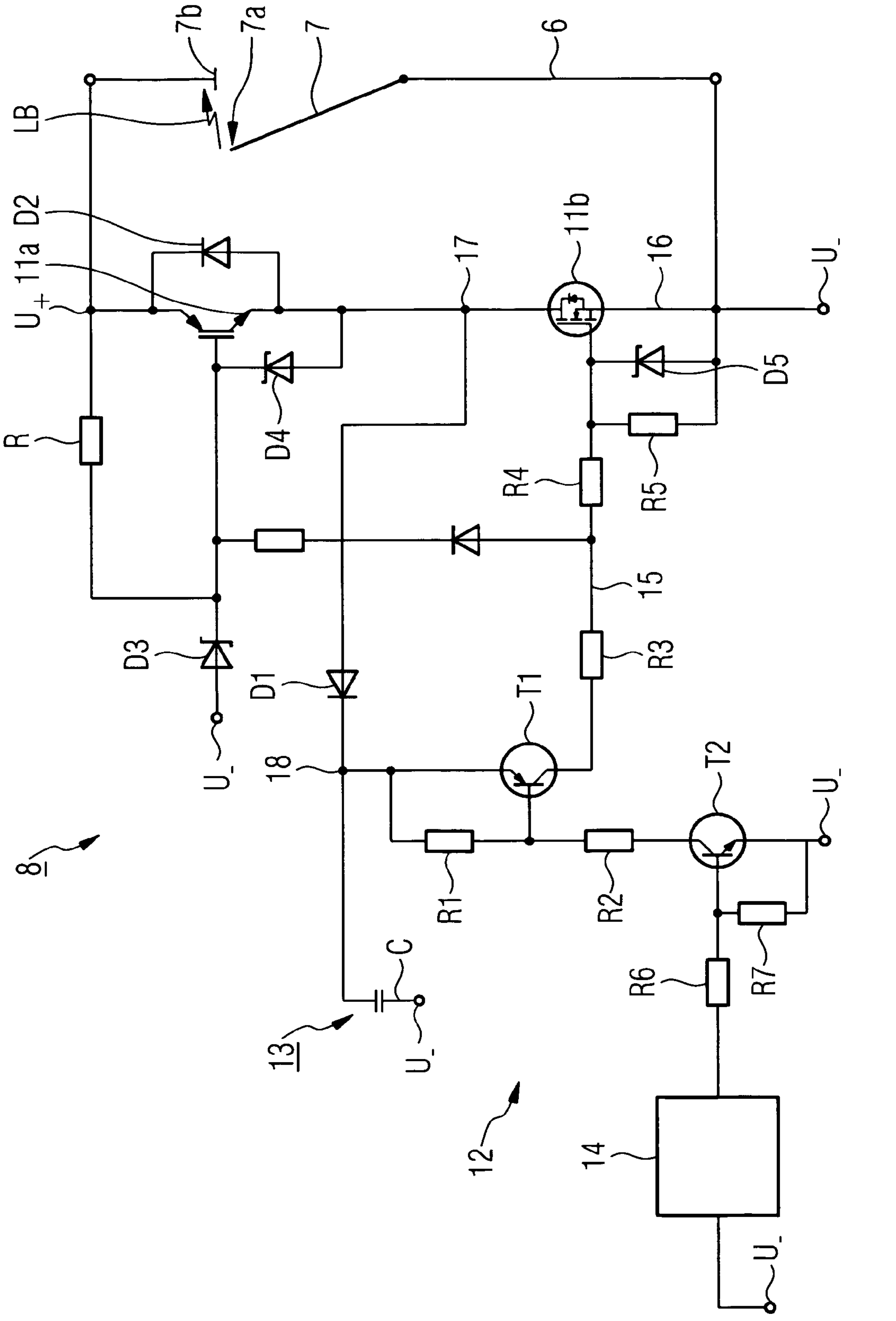
FIG. 2 shows, in a comparatively more detailed circuit diagram, the disconnecting apparatus with two semiconductor switches in a cascode arrangement and with capacitors as energy storage devices.

The semiconductor electronics 8 essentially comprise a semiconductor switch 11 which is connected in parallel with the mechanical switch 7, and a control circuit 12 having an energy storage device 13 and a timer 14. The control circuit 12 is preferably connected to the main current path 6 via a resistor or a series of resistors R (FIG. 2). The gate of an IGBT preferably inserted as a semiconductor switch 11 forms the control input 15 of the semiconductor circuit 8. This control input 15 is led to the main current path 6 via the control circuit 12.

FIG. 2 shows a comparatively more detailed circuit diagram of the electronics 8, connected in parallel with the mechanical switch 7, of the autarchic hybrid disconnecting switch. The first semiconductor switch (IGBT) 11*a* can be identified in a cascode arrangement connected in series with a second semiconductor switch 11*b* in the form of a MOSFET. The cascode arrangement with the two semiconductor switches 11*a*, 11*b* thus, analogously with FIG. 1, forms the commutation path 16 parallel with the mechanical switch 7 and thus with the main current path 6.

In the disconnecting switch arrangement shown in FIG. 1 and in the cascode arrangement illustrated in FIG. 2, the first semiconductor switch 11*a* is led between the direct current source 2 and the hybrid disconnecting switch 7, 8 to the main current path 6. There the potential $U_+$ is always greater than the potential $U_-$ on the opposite switch side at which the second semiconductor switch (MOSFET) 11*b* is guided to the main power circuit 6. The positive potential $U_+$ is 0V when the mechanical switch 7 is closed.

The first semiconductor switch (IGBT) 11*a* is connected to a freewheeling diode D2. A first Zener diode D3 is connected on the anode side to the potential $U_-$ and on the cathode side to the gate (control input 15) of the first semiconductor switch (IGBT) 11*a*. A further Zener diode D4 is connected on the cathode side in turn to the gate (control input 15) and on the anode side to the emitter of the first semiconductor switch (IGBT) 11*a*.

A diode D1 is led on the anode side to a center or cascode tap 17 between the first and second semiconductor switches 11*a* and 11*b* of the cascode arrangement, and is connected on the cathode side to the potential $U_-$ via a capacitor C which serves as an energy storage device 13. The energy storage device 13 can also be formed by multiple capacitors C. Via an anode-side voltage tap 18 between the diode D1 and the energy storage device 13 and the capacitor C, a transistor T1 connected to ohmic resistors R1 and R2 is connected via further resistors R3 and R4 to the gate of the second semiconductor switch (MOSFET) 15, guided in turn to the control input 15 of the semiconductor electronics 8. A further Zener diode D5 with a parallel resistor R5 is connected on the cathode side to the gate and on the anode side to the emitter of the second semiconductor switch (MOSFET) 11*b*.

The transistor T1 is controlled on the base side by a transistor T2 which for its part is connected on the base side via an ohmic resistor R6 to the timer 14 which is designed, for example, as a monoflop. The transistor T2 is additionally connected on the base/emitter side to a further resistor R7.

Figure 3:
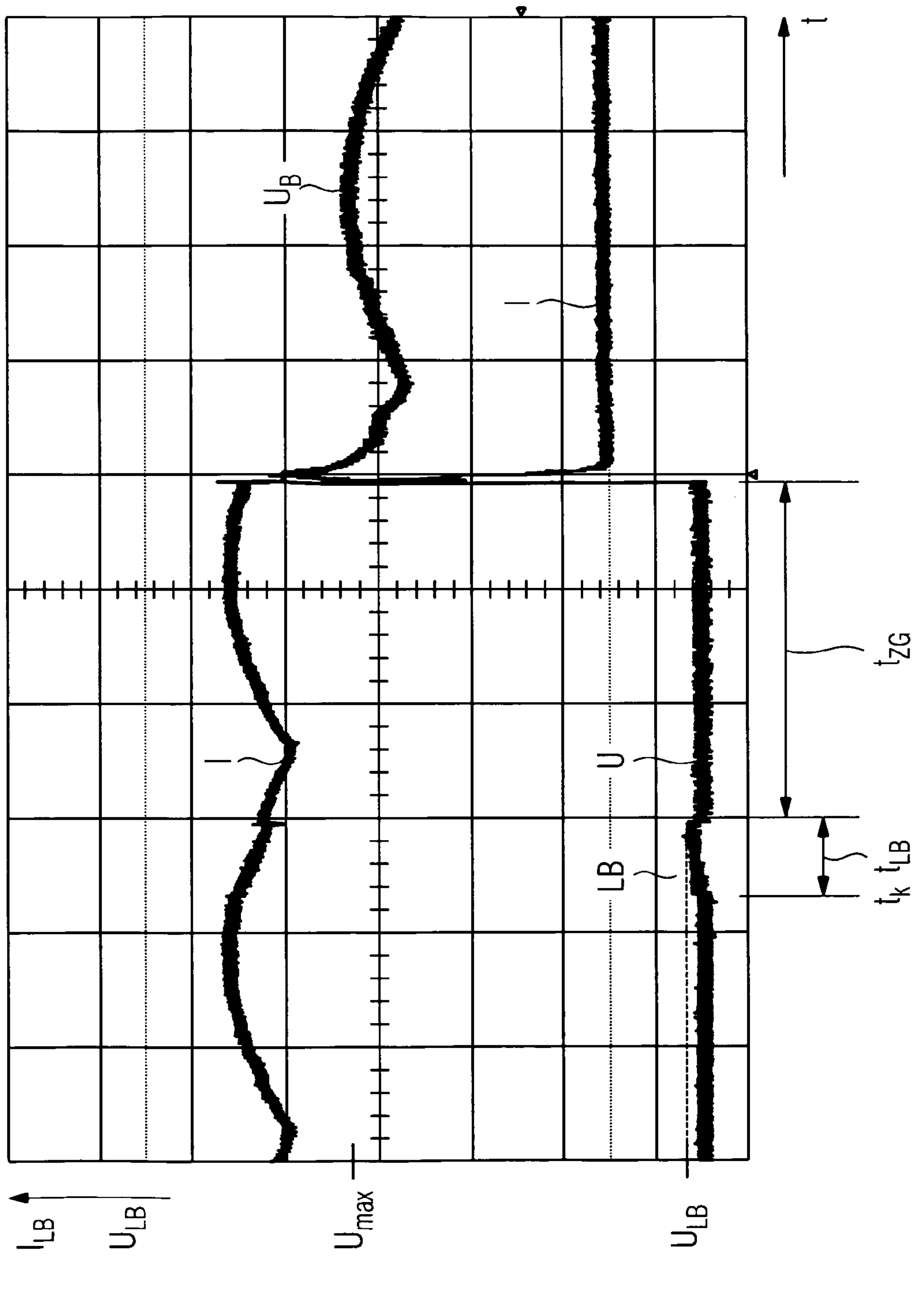
FIG. 3 shows, in a graph plotting current/voltage against time, the resulting course of switch current and voltage over time before, during and after the extinguishing of an arc.

FIG. 3 shows, in a graph plotting current/voltage against time, the course of the switch voltage U and the switch current I of the hybrid disconnecting switch 7, 8 over time before a contact of the mechanical switch 7 opens at time $t_K$ and during the duration $t_{LB}$ of an arc LB across the switch 7 or its switching contacts 7*a*, 7*b* (FIG. 2), as well as during a duration $t_{ZG}$ specified, predetermined or set by the timer 14. When the mechanical switch 7 is closed, the main current path 6 has low impedance, whereas the parallel commutation path 16 of the hybrid disconnecting switch 7, 8 has high impedance and thus acts as a current barrier.

The current course illustrated in the left-hand side of FIG. 3 represents the current I flowing exclusively across the mechanical switch 7 until the time $t_K$ of the contact opening of the switching contacts 7*a* and 7*b*. The opening of the mechanical switch 7 has already taken place at a time, not specified in more detail, before the time $t_K$ of the contact opening. The switch voltage U illustrated in the left-hand lower half of FIG. 3 is virtually 0V before the time $t_K$ of the contact opening and increases steeply with the opening of the switching contacts 7*a*, 7*b* of the mechanical switch 7 at time $t_K$ to a value which is characteristic for an arc LB and with a typical arc voltage $U_{LB}$ of, for example, 20V to 30V. The positive potential $U_+$ thus tends towards this arc voltage $U_{LB} \approx 30V$ when the mechanical switch 7 opens.

During the duration (arc time interval) $t_{LB}$ following the contact opening time $t_K$, the commutation begins of the switch current I, substantially corresponding to the arc current, from the main current path 6 onto the commutation path 16.

During the duration $t_{LB}$ the arc current I is virtually split between the main current path 6—in other words across the mechanical switch 7—and the commutation path 16—in other words, the semiconductor electronics 8. The energy storage device 13 is charged during this arc time interval $t_{LB}$. The duration $t_{LB}$ is here set such that, on the one hand, sufficient energy is made available for reliable control of the semiconductor electronics 8, in particular to switch them off for a period $t_{ZG}$ subsequent to the duration $t_{LB}$ representing the duration of the arc. On the other hand, the duration $t_{LB}$ is sufficiently short to prevent undesirable contact erosion or wear of the switch 7 or the switching contacts 7*a*, 7*b*.

When the arc LB begins and the arc voltage $U_{LB}$ occurs, the first semiconductor switch (IGBT) 11*a* is turned on by the resistor R (FIG. 2) at least to such an extent that a sufficient charging voltage and a sufficient arc or charging current is made available for the capacitors C and hence for the energy storage device 13. To do this, a control circuit for the electronics 8 is preferably created with the corresponding connection of the first semiconductor switch (IGBT) 11*a* to the resistor R and the Zener diode D3, via which control circuit the voltage is set at the cascode tap 17 to, for example, $U_{Ab}$=12V (DC). A fraction of the arc current and hence of the switch current I of the hybrid disconnecting switch 7, 8 hereby flows through the first semiconductor switch (IGBT) 11*a* close to the positive potential $U_+$.

The tapping voltage $U_{Ab}$ serves to supply the control circuit 12 of the electronics 8, formed essentially by the transistors T1 and T2 as well as the timer 14 and the energy storage device 13. The diode D1 which is connected on the anode side to the cascode tap 17 and on the cathode side to the capacitor C prevents the charging current from flowing back from the capacitors C and via the commutation path 16 toward the potential $U_-$.

If sufficient energy is contained in the capacitor C and hence in the energy storage device 13, and consequently if a sufficiently high control or switching voltage $U_{Sp}$ is present at the voltage tap 18, the transistor T1 and consequently the transistor T2 turn on, so that the two semiconductor switches 11*a*, 11*b* also turn on completely. Because the resistance of the now turned-on semiconductor switches 11*a*, 11*b* is substantially lower than the very high resistance of the gap section, formed by the open switch 7, of the main current path 6, the arc or switch current I flows almost exclusively via the commutation path 16. The positive potential $U_+$ thus again tends toward 0V when the switch current I is commutated onto the electronics 8. The arc LB is consequently extinguished between the contacts 7*a*, 7*b* of the mechanical switch 7.

The charging capacity and hence the stored energy contained in the capacitor C is calculated such that the semiconductor electronics 8 carries the switch current I for a duration $t_{ZG}$ predetermined by the timer 14. This duration $t_{ZG}$ can be set to, for example, $t_{ZG}$=3 ms. This duration $t_{ZG}$ is calculated, and the timer 14 is thus set, essentially in accordance with the application-specific or typical durations for complete extinguishing of the arc LB and with sufficient cooling of the plasma formed thereby. A decisive factor hereby is that no new arc LB can occur after the electronics 8 have been switched off, with a commutation path 16 which as a result in turn has high impedance and semiconductor electronics 8 that consequently act as a current barrier at the still open mechanical switch 7 or over its switching contacts 7*a*, 7*b*.

At the end of the duration $t_{ZG}$ set by the timer 14, the switch current I falls to almost zero (I=0A), while at the same time the switch voltage increases to the operating voltage $U_B$ delivered by the direct current source 2, for example by 1000V (DC) to 1500V (DC). The positive potential $U_+$ thus tends toward this operating voltage $U_B \approx 1000V$ when the commutation path 16 has high impedance owing to the blocking of the semiconductor switches 11 and the electronics 8 hence again act as a current barrier.

As at this time the main current path 6 is galvanically open, with the commutation path 16 simultaneously having high impedance, arc-less direct current interruption between the direct current source 2 and the electrical device 3 is already achieved. The connection between the direct current source 2 and the inverter 3 which, for example, takes the form of the electrical device is consequently already reliably broken. To effect a shockproof galvanic interruption, the mechanical disconnecting element 10 of the disconnecting apparatus 1 can then additionally be opened with no load or arc.

The invention claimed is:

1. A disconnecting apparatus for direct current interruption between a direct current source and an electrical device, comprising:

a current-conducting mechanical switching contact connected between the direct current source and the electrical device;

semiconductor electronics connected in parallel with said switching contact, said semiconductor electronics acting as a current barrier when said switching contact is closed, and when said semiconductor electronics become current-conductive, an arc current is commutated from said switching contact to said semiconductor electronics;

said semiconductor electronics having a first semiconductor switch and a second semiconductor switch respectively connected in series;

said semiconductor electronics having a control input connected to said switching contact such that, when said switching contact opens, an arc voltage across said switching contact generated as a consequence of an arc renders said semiconductor electronics current-conductive;

said semiconductor electronics having an energy storage device connected to be charged as a consequence of the arc within an arc duration; and a timer configured to start at an end of a charging time of said energy storage device in order to switch off said semiconductor electronics with no arc being formed;

wherein the arc voltage charging said energy storage device is tapped at a node between said first semiconductor switch and said second semiconductor switch;

wherein the arc voltage tapped at said node between said first semiconductor switch and said second semiconductor switch also provides a supply voltage to said semiconductor electronics and said timer.

2. The disconnecting apparatus according to claim 1, wherein said switching contact and said semiconductor electronics are connected between a photovoltaic generator and an inverter.

3. The disconnecting apparatus according to claim 1, wherein, at an end of the charging time of said energy storage device, the switch current flowing as a result of the arc is completely commutated to said semiconductor electronics.

4. The disconnecting apparatus according to claim 1, wherein the arc duration is determined by a charging duration or a capacity of said energy storage device.

5. The disconnecting apparatus according to claim 1, wherein said semiconductor electronics comprises an IGBT and a MOSFET connected in series with one another.

6. The disconnecting apparatus according to claim 1, wherein said semiconductor switch has a control input connected via an ohmic resistor to a positive voltage potential of said direct current source when said switching contact is open.

7. The disconnecting apparatus according to claim 1, which comprises a mechanical disconnecting element for galvanic direct current interruption, connected in series with a parallel circuit consisting of said switching contact and said semiconductor electronics.

* * * * *